(12) United States Patent
Huijser

(10) Patent No.: US 9,628,117 B2
(45) Date of Patent: Apr. 18, 2017

(54) AMPLIFIER

(71) Applicant: NXP B.V., Eindhoven (NL)

(72) Inventor: Jan Paulus Freerk Huijser, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/853,878

(22) Filed: Sep. 14, 2015

(65) Prior Publication Data

US 2016/0099730 A1    Apr. 7, 2016

(30) Foreign Application Priority Data

Sep. 16, 2014    (EP) .................................... 14184900

(51) Int. Cl.
*H01Q 11/12*    (2006.01)
*H04B 1/04*    (2006.01)
(Continued)

(52) U.S. Cl.
CPC .............. *H04B 1/04* (2013.01); *H03F 1/0205* (2013.01); *H03F 1/0211* (2013.01); *H03F 3/181* (2013.01); *H03F 3/183* (2013.01); *H03F 3/189* (2013.01); *H03F 3/19* (2013.01); *H03F 3/217* (2013.01); *H03F 3/68* (2013.01);
(Continued)

(58) Field of Classification Search
CPC ....... H04B 1/04; H03F 1/0211; H03F 1/0233; H03F 3/189; H03F 3/217; H03F 2200/03; H03F 2200/451; H03F 2200/462; H03G 3/20; H03G 3/30
USPC ......... 455/67.11, 115.1, 115.3, 127.1, 127.2; 330/102, 250, 251
See application file for complete search history.

(56) References Cited

U.S. PATENT DOCUMENTS 8,731,496 B2 * 5/2014 Drogi ........................ H03F 3/24
                                                    455/127.1
8,774,739 B2 * 7/2014 Ripley ................ H04B 1/1607
                                                    455/127.1
(Continued)

FOREIGN PATENT DOCUMENTS

CN    202798158    3/2013
KR    101271166 B1    6/2013

OTHER PUBLICATIONS

Extended European Search Report mailed Nov. 21, 2014 for EP Counterpart Application EP 14184900.0, 8 pages.

*Primary Examiner* — Quochien B Vuong

(57) ABSTRACT

Mobile devices such as mobile phones include amplifiers for example audio and RF amplifiers which may consume a significant amount of the available power supplied by a battery. An amplifying system 100 for a mobile device is described the amplifying system comprising a current monitor 12 arranged between a first supply node and a second supply node and operable to monitor a current flow between the first and second supply nodes and to output a monitored current value; a peak current limiter 14 configured to limit an amplifier current to an amplifier to not exceed a maximum peak current value and coupled to a one of the first supply node and the second supply node; a controller coupled to the current monitor output and configured to control the peak current limiter. The amplifying system can dynamically manage the peak current available to the amplifier dependent on the load current being supplied by a battery.

20 Claims, 5 Drawing Sheets

(51) Int. Cl.
*H03F 3/217* (2006.01)
*H03F 1/02* (2006.01)
*H03F 3/181* (2006.01)
*H03F 3/189* (2006.01)
*H03F 3/68* (2006.01)
*H03F 3/183* (2006.01)
*H03F 3/19* (2006.01)
*H04W 88/02* (2009.01)
*H02M 3/158* (2006.01)

(52) U.S. Cl.
CPC ............ *H04W 88/02* (2013.01); *H02M 3/158* (2013.01); *H03F 2200/03* (2013.01); *H03F 2200/301* (2013.01); *H03F 2200/451* (2013.01); *H03F 2200/471* (2013.01); *H03F 2200/481* (2013.01)

(56) References Cited

U.S. PATENT DOCUMENTS

| | | |
|---|---|---|
| 9,041,468 B2 * | 5/2015 | Krabbenborg ............ G05F 5/00 330/127 |
| 2011/0019445 A1 | 1/2011 | Wu et al. |
| 2011/0228570 A1 | 9/2011 | Li et al. |
| 2013/0077358 A1 | 3/2013 | Gaknoki et al. |
| 2013/0247533 A1 | 9/2013 | Zupan |
| 2014/0075133 A1 | 3/2014 | Li et al. |
| 2014/0112079 A1 | 4/2014 | Wakrat et al. |
| 2014/0247029 A1 | 9/2014 | Krabbenborg |

* cited by examiner

AMPLIFIER

CROSS-REFERENCE TO RELATED APPLICATIONS

This application claims the priority under 35 U.S.C. §119 of European patent application no. 14184900.0, filed Sep. 16, 2014 the contents of which are incorporated by reference herein.

This invention relates to an amplifier system for mobile devices.

Mobile devices such as mobile phones, tablet computers, laptops, ultrabook computers, wearable devices and portable medical devices may have a number of amplifiers. These may be for example audio amplifiers for driving loudspeakers and radio frequency (RF) amplifiers Audio amplifiers may require relatively large peak currents to drive a loudspeaker to its maximum power capability.

In addition, mobiles phones increasingly have stereo speakers so potentially doubling the power requirement. For example audio amplifiers used in mobile phones may consume over 5 amps when driving a loudspeaker. RF amplifiers may require relatively large peak currents to transmit a RF signal to a maximum specified range. However, the battery of a mobile device has limited capability to deliver large peak currents. For example a mobile phone battery may have a peak current supply capacity of approximately 6 amps. If the peak current demand is greater than the current which the battery supplies, the voltage supply will drop which may cause the device mobile phone to reset. As a result the current supplied to each amplifier is limited to particular value so that the total peak current supplied by the battery to the mobile phone does not exceed the peak current supply capacity of the battery.

Various aspects of the invention are defined in the accompanying claims. In a first aspect there is defined an amplifying system for a mobile device, the amplifying system comprising a current monitor arranged between a first supply node and a second supply node and operable to monitor a current flow between the first and second supply nodes and to output a monitored current value; a peak current limiter configured to limit an amplifier current to an amplifier to not exceed a maximum peak current value and coupled to a one of the first supply node and the second supply node; a controller coupled to the current monitor output and configured to control the peak current limiter; and wherein the first supply node is operably coupled to a battery for supplying a battery current and the controller is operable to set the maximum peak current value of the peak current limiter in dependence on a difference between the battery current and the amplifier current.

The amplifying system allows the current demand of a larger system in which an amplifying system is incorporated to be dynamically monitored. In embodiments the controller is operable to prevent the battery current from exceeding a predefined battery peak current value by controlling the peak current limiter to set the maximum peak current value to a value of less than or equal to the difference between a predefined maximum battery peak current value and the system current, wherein the system current is equal to the difference between the battery current and the amplifier current.

The maximum peak current demanded by the amplifier in the amplifier system can thus be modified to ensure that as much of the available capacity or headroom of the battery is available as possible. The amplifier may not require all the available current in which case the maximum peak current may be set to a value of less than the available headroom.

In embodiments the peak current limiter is coupled to the first supply node and the monitored current value is equal to the difference between the battery current and the amplifier current.

In embodiments the amplifying system may comprise an amplifier current sensor operable to determine the current drawn by the amplifier, operable to determine the amplifier current drawn by the amplifier, and wherein the peak current limiter is coupled to the second supply node and wherein in operation the monitored current value is equal to the battery current and the controller is further operable to determine a difference between the monitored current and the amplifier current.

The current monitor may directly monitor the total load of the battery with an additional sensor to determine the current drawn by the amplifier.

In embodiments of the amplifying system the current monitor may comprises a sense resistor coupled between the first supply node and the second supply node. Sense resistors may be integrated together with other components in an integrated circuit or located externally.

In embodiments of the amplifying system, the current monitor may comprise a voltage detector having a first input connected to the supply input, a second input connected to the supply output and an output coupled to the current monitor value output and operable to detect a voltage difference corresponding to a current flowing between the first supply node and the second supply node.

In embodiments of the amplifying system the amplifier may comprise a class-D audio amplifier.

In embodiments of the amplifying system the controller may comprise a digital signal processor.

Embodiments of the amplifying system may comprise a further amplifier and a further peak current limiter configured to limit a further amplifier current to the further amplifier to not exceed a further maximum peak current value and coupled to a one of the supply input and the system supply output; wherein the controller is further configured to control the further peak current limiter and wherein the controller is operable set the maximum peak current value and the further maximum peak current value in dependence of a difference between the battery current, the amplifier current and the further amplifier current.

In embodiments of the amplifying system comprising a further amplifier, the controller is further operable to prevent the battery current from exceeding a predefined battery peak current value by controlling the peak current limiter to set the sum of the maximum peak current value and the further maximum peak current value to a value of less than or equal to the difference between the predefined maximum battery peak current value, the amplifier current and the further amplifier current.

Embodiments of the amplifying system may be incorporated into an audio amplifier integrated circuit for mobile devices. The audio amplifier may dynamically adjust peak current consumption independently of a mobile phone operating system and other mobile phone hardware.

In embodiments of the amplifying system, the amplifier may be an RF amplifier.

Embodiments of the amplifying system may be included in a mobile device.

Embodiments of the amplifying system may be included in a RF transmitter.

BRIEF DESCRIPTION OF THE DRAWINGS

In the figures and description like reference numerals refer to like features Embodiments of the invention are now described in detail, by way of example only, illustrated by the accompanying drawings in which.

DETAILED DESCRIPTION

Figure 1:
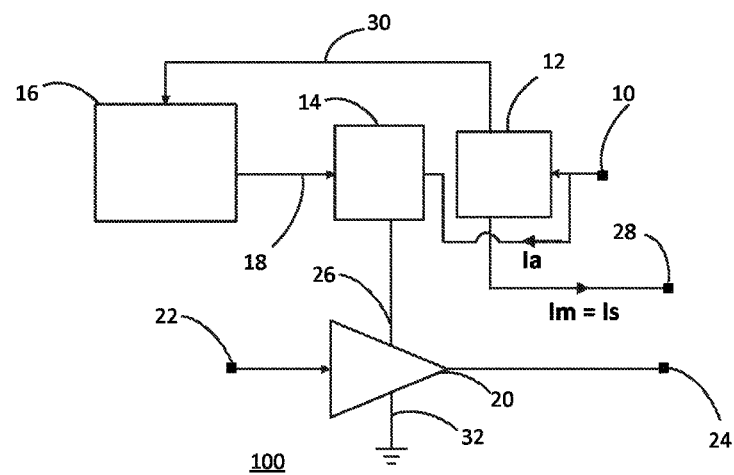
FIG. 1 shows an amplifying system according to an embodiment.

FIG. 1 shows an amplifier system 100. A current monitor 12 may be connected to a first supply node 10. First supply node 10 may be connected to a peak current limiter 14. A supply node may be for example a pin on an integrated circuit or a point on a metal track Current monitor 12 may also have a second supply node 28. A current value output 30 of the current monitor 12 may be connected to a controller 16. A control output 18 from the controller 16 may be connected to the peak current limiter 14. A peak current limited supply output 26 may be connected to an amplifier 20 having an amplifier input 22 and amplifier output 24. Amplifier 20 may have a ground connection 32.

In operation, the first supply node 10 of the amplifier system 100 may be connected to a battery. The battery has a specified peak current supply value which may be defined as a maximum peak current value in the controller 16. The controller 16 may compare a monitored current value $I_m$, supplied by the current monitor 12 which indicates the current consumption by the rest of the system excluding the amplifier 20 $I_s$, with the maximum peak current value.

Figure 2:
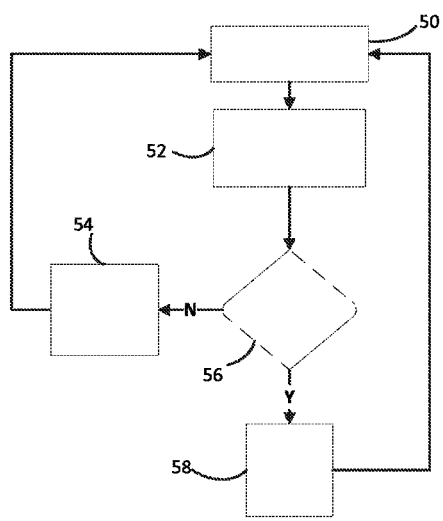
FIG. 2 illustrates a method of controlling the amplifying system of FIG. 1.

The controller 16 may determine the difference between the maximum peak current value and the monitored current value $I_m$; the difference may correspond to the amount of headroom available from the battery supply. The controller 16 may set the peak current of the peak current limiter to a value of less than or equal to the amount of headroom available for the battery supply. The peak current value may represent an absolute peak current value or may represent an averaged peak current value. FIG. 2 illustrates an example of the operation of the controller 16 in an amplifier system. The controller 16 may sample a value of current supplied to the system, through second supply node 28, from current value output 30 in step 50. This may correspond to the current supplied to the remainder of a system $I_s$ excluding the amplifier 20. When incorporated in a mobile device the value of current $I_s$ may represent a current supplied to additional circuitry to the amplifier system 100. In step 52 the controller 16 may subtract the sampled current value from the predetermined maximum peak current value of the battery to give a value of the maximum remaining peak current supply capacity, that is to say headroom, of the battery. In comparison step 56, the controller 16 may compare the headroom with the maximum peak current required by the amplifier 20. If the available headroom is greater than the maximum peak current requirement of the amplifier 20, in step 58, the controller 16 may set the peak current of the peak current limiter 14 to the maximum required peak current of the amplifier 20. The controller may then return to step 50 and the cycle repeats. Conversely, in step 56, if the maximum peak current required by the amplifier 20 is greater than the headroom available, then the controller may in step 54 set the peak current limit of the peak current limiter 16 to a value equal to the available headroom.

The amplifier system 100 may be incorporated in a mobile device such as a mobile phone. Because a mobile device will have other components which also require current from the battery, the amount of headroom available in the battery supply for supplying the amplifier system 100 may continuously vary. By continuously monitoring the amount of current drawn by the rest of the system, the peak current the peak current limiter 14 may be continuously altered so that the maximum possible current from a battery can be supplied to the amplifier system 100. The controller 16 may be implemented in hardware, or a combination of hardware and software. The output value of the current from the current monitor 12 may be an analogue signal in which case the controller 16 may include an analogue to digital converter. Alternatively the output value of the current from the current monitor 12 may be a digital signal. The controller 16 may sample the output value of the current from the current monitor 12 at a frequency of greater than 2 KHz. Consequently the peak current limit of the amplifier system may be adjusted rapidly dependent on the demands from other components in a mobile device. This may be particularly important for mobile devices such as mobile phones where different system resources such as Wi-Fi, audio, screen may be activated and deactivated at different times with respect to each other. The amplifier system 100 may allow the peak power limit to be dynamically altered in real-time without any modification to the operating system of the mobile phone, and without any restrictions on other functional blocks used inside a mobile phone or other mobile device. The amplifier system 100 may enable dynamic battery peak current management independently of any operating system or other hardware implemented within a mobile device such as a mobile phone.

The controller 16, the peak current limiter 14, the amplifier 20, and at least part of the battery monitor 12, may be integrated into a single integrated circuit.

Figure 3:
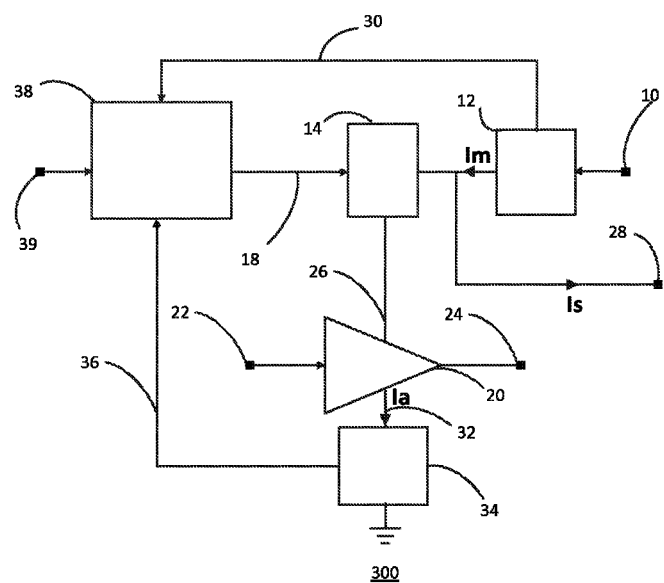
FIG. 3 shows a further amplifying system according to an embodiment.

FIG. 3 shows an amplifier system 300. Current monitor 12 may be connected to a first supply node 10. Current monitor 12 may also have a second supply node 28. Power supply output may be connected to a peak current limiter 14. A current value output 30 of the current monitor 12 may be connected to a controller 38. A control output 18 from the controller 16 may be connected to the peak current limiter 14. A peak current limited supply output 26 may be connected to an amplifier 20 having an amplifier input 22 and amplifier output 24. Amplifier 20 may have a ground connection 32 connected to ground via an amplifier current sensor 32. Amplifier current sensor 32 may have an amplifier current sensor value output 36 connected to controller 38. Controller 38 may optionally have an external control input 39 to receive data.

In operation, the amplifier system 200 is connected to a battery. The battery may be connected to first supply node 10. The battery has a specified peak current supply value which may be defined as a maximum peak current value in the controller 38. The controller 38 may subtract a monitored current value supplied by the current monitor 12 from an amplifier current value Ia supplied by amplifier current sensor 34, to determine a value of net current consumption by the rest of the system excluding the amplifier 20. The controller 16 may determine the difference between the maximum peak current value and the net current value; the difference corresponds to the amount of headroom available from the battery supply. The controller 38 may set the peak current of the peak current limiter to a value of less than or equal to the amount of headroom available for the battery supply.

Figure 4:
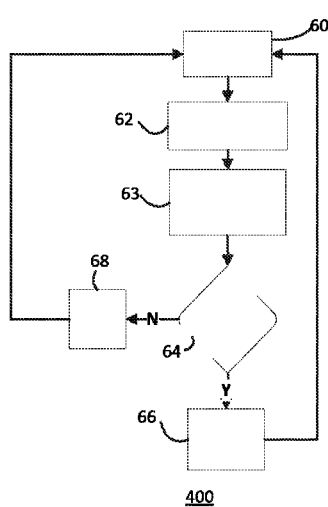
FIG. 4 illustrates a method of controlling the amplifying system of FIG. 3.

FIG. 4 illustrates a flow diagram 400 showing an example of operation of the controller 38 in amplifier system 300. The controller 38 may sample a value of current supplied by a battery in step 60. In step 62, the controller 38 may sample a value of amplifier current. In step 63 the controller 38 may subtract the sampled battery current value from the predetermined maximum peak current value of the battery and add the amplifier current value resulting in a value of the maximum remaining peak current supply capacity, that is to say headroom, of the battery available to the amplifier 20. In comparison step 64, the controller 38 may compare the headroom with the maximum peak current required by the amplifier 20. If the available headroom is greater than the maximum peak current requirements of the amplifier 20, in step 66, the controller 38 may set the peak current of the peak current limiter 14 to the maximum required peak current of the amplifier 20. The controller may then return to step 60 and the cycle repeats. Conversely, in step 64, if the maximum peak current required by the amplifier 20 is greater than the headroom available, then the controller 38 may in step 68 set the peak current limit of the peak current limiter 16 to a value equal to the available headroom.

By continuously monitoring the amount of current drawn by the rest of the system, the peak current the peak current limiter 14 may be continuously altered so that the maximum possible current from a battery may be supplied to the amplifier system 300. The amplifier system 300 may enable dynamic battery peak current management independently of any operating system or other hardware implemented within a mobile device such as a mobile phone.

Figure 5A:
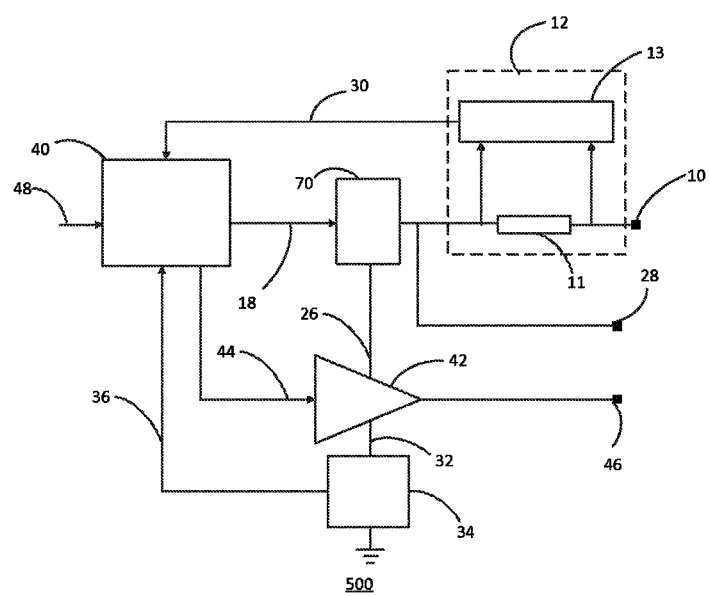
FIG. 5A shows an audio amplifying system according to an embodiment including a dc booster and peak current limiter and FIG. 5B shows a typical implementation of a dc booster and peak current limiter.

FIG. 5A shows an audio amplifier system 500. A first supply node 10 may be connected to a first terminal of a current sense resistor 11. A second supply node 28 may be connected to a second terminal of the current sense resistor 11. A voltage detector 13 may be connected across each of the terminals of sense resistor 32. The skilled person will appreciate that in operation the voltage detector 13 may sense the difference in the voltage across the sense resistor 11 and, based on the difference in the voltage output, the current sensor may output a value on supply current value output 30, which represents the current flowing through the sense resistor 11. The sense resistor 11 may be implemented as part of an integrated circuit including the audio amplifier system 500. Alternatively sense resistor 11 may be implemented as a discrete component outside an integrated circuit having the remainder of the components of the audio amplifier system 500. The sense resistor 11 may have a resistance value in the range of 10 milliOhm and 30 milliOhm. A current monitor 12' may include the sense resistor 11, and the voltage detector 13. Alternatively the voltage detector may be coupled to supply nodes where may be nodes on a metal track and detect a small voltage drop due to the resistance of the metal track. The peak current limiter supply output 26 may be connected to audio amplifier 42 which may be a class D amplifier. The audio amplifier 42 may have an audio input 44 and an audio output 46. Audio output 46 may be a differential output. A ground connection of audio amplifier 32 may be connected to a ground via an amplifier current sensor 34. An amplifier current value output 36 may be connected to an audio controller 40 which may be a digital signal processor. Audio controller 40 may have an audio input 48 which may be a digital input and an audio output 44 which may be an analog or digital output connected to audio amplifier 42. Audio controller 40 may have a control output 18 connected to a dc-dc booster 70 which may include a peak current limiter. A supply output 26 from dc-dc booster 70 may be connected to audio amplifier 42.

Figure 5B:
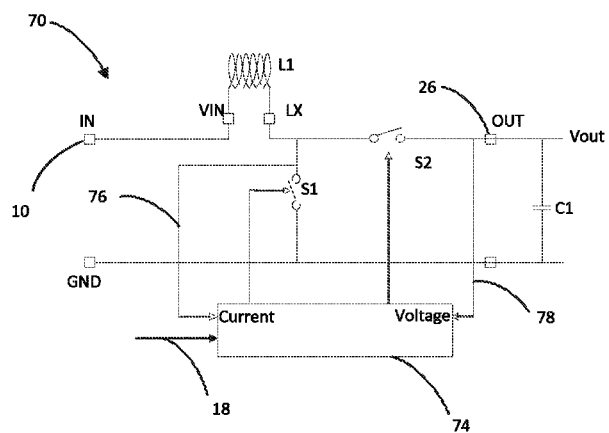

Further detail of a typical circuit of a dc-dc booster and the connections in audio amplifier system 500 is shown in FIG. 5B. Inductor L1 may be connected in series between the second supply node 28 and a first terminal of the switch S2 which may be a MOS transistor. Second terminal of switch S2 which may be a MOS transistor may be connected to audio amplifier power supply input 26. A switch S1 may be connected between the first terminal of switch S2 and a ground connection. A DC-DC booster controller 74, which may typically be a digital controller, may have a control output connection to a control terminal switch S1, which control terminal may be a gate of a MOS transistor. DC-DC booster controller 74 may have a control output connection to a control terminal switch S2 which may be a gate of a MOS transistor. DC-DC booster controller 74 may have a control input connection 18 from audio controller 40. DC-DC booster controller may have a current sense input 76 connected to the first terminal of switch S2. DC-DC booster controller 74 may have a voltage sense input 78 connected to a second terminal of switch S2. A capacitor C1 may be connected between the second terminal of switch S2 and ground.

Figure 6:
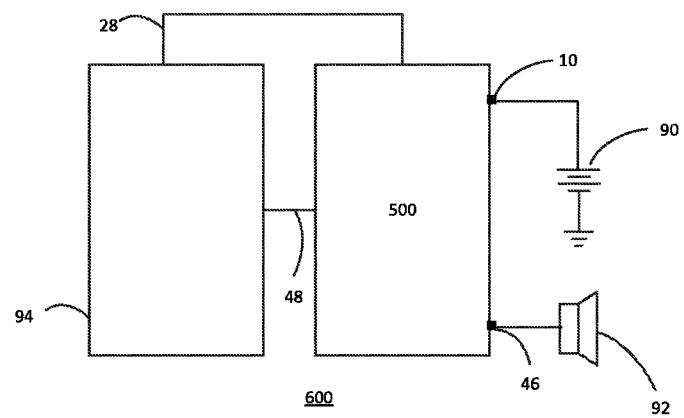
FIG. 6 illustrates a mobile phone including an audio amplifier according to an embodiment.

In operation, the dc-dc booster operates by periodically opening and closing switch S1. Whilst S1 is closed, current flows from the system power supply 28 through the inductor, and switch S1 to ground: as the current increases, the magnetic field in the inductor increases, and energy is stored in the inductor. S2 is configured as a synchronous rectifier; that is to say, when switch S1 is closed, switch S2 is opened in order to prevent C1 from discharging. When S1 is opened, S2 is closed, and the only path for the inductor current is to the output 26, to charge the capacitor. However, the voltage across the output capacitor C1 is higher than that at the input by the voltage across the inductor. The skilled person will appreciate that the peak current can be limited by the DC-DC booster controller 74 for example as described in published European patent application EP2775599. The audio amplifier system 500 may be part of a mobile device such as a mobile phone 600 as illustrated in FIG. 6. First supply node 10 may be connected to a battery 90 and audio output 46 may be connected to a speaker 92. A baseband processor 94 may have an audio output connected to audio input 48 of the audio amplifier system 500. The current monitor 12 in the audio amplifier system 500 may determine the total current provided by the battery to mobile phone 600 including the base band processor 94 and other mobile phone components such as microphones, Wi-Fi transmitters (not shown). For example, the battery may provide a maximum peak current of 6 Amps. A mobile phone audio amplifier system may require peak current of between 1 amp and 2.8 amps for each speaker amplifier. The audio amplifier system 500 may automatically alter the maximum peak value of the peak current supplied by dc-dc booster 70 so the audio amplifier system 500 can potentially use all the available peak current supply capability of the battery 90.

Figure 7:
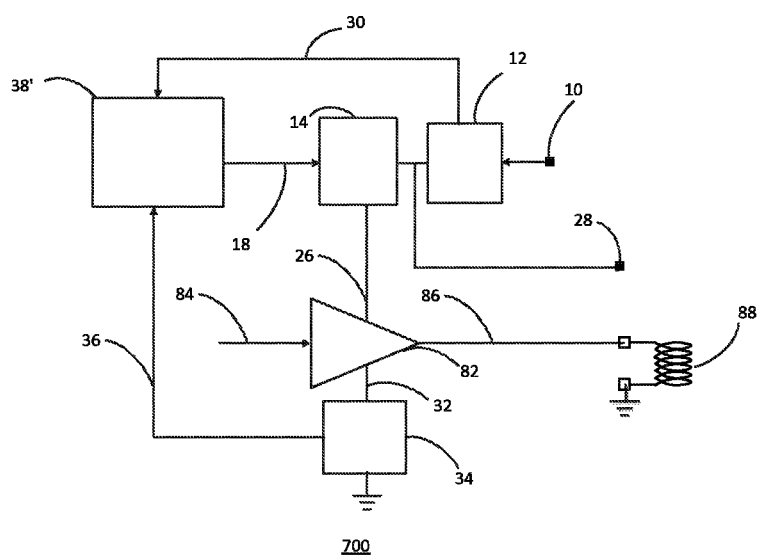
FIG. 7 shows an RF amplifying system according to an embodiment.

FIG. 7 shows an RF amplifier system 700. Current monitor 12 may be connected to a first supply node 10. Current monitor 12 may also have a second supply node 28.

Power supply output may be connected to a peak current limiter 14. A current value output 30 of the current monitor 12 may be connected to a controller 38'. A control output 18 from the controller 38' may be connected to the peak current limiter 14. A peak current limited supply output 26 may be connected to an RF amplifier 82 having an RF amplifier input 84 and RF amplifier output 86. RF amplifier output 86 may be connected to an inductor or antenna 88.

Amplifier 82 may have a ground connection 32 connected to ground via an amplifier current sensor 34. Amplifier current sensor 34 may have an amplifier current sensor value output 36 connected to controller 38'.

In operation, the power to RF amplifier system 800 may be supplied from a battery connected to first supply node 10. The battery has a specified peak current supply value which may be defined as a maximum peak current value in the controller 38'. The controller 38' may subtract a monitored current value supplied by the current monitor 12 from an amplifier current value supplied by amplifier current sensor 34, to determine a value of net current consumption by the rest of the system excluding the RF amplifier 82. The controller 38' may determine the difference between the maximum peak current value and the net current value; the difference corresponds to the amount of headroom available from the battery supply. The controller 38' may set the peak current of the peak current limiter to a value of less than or equal to the amount of headroom available for the battery supply.

Example RF amplifier systems may be included in a mobile phone and may be Wi-Fi transmitters, or cellular transmitters.

Figure 8:
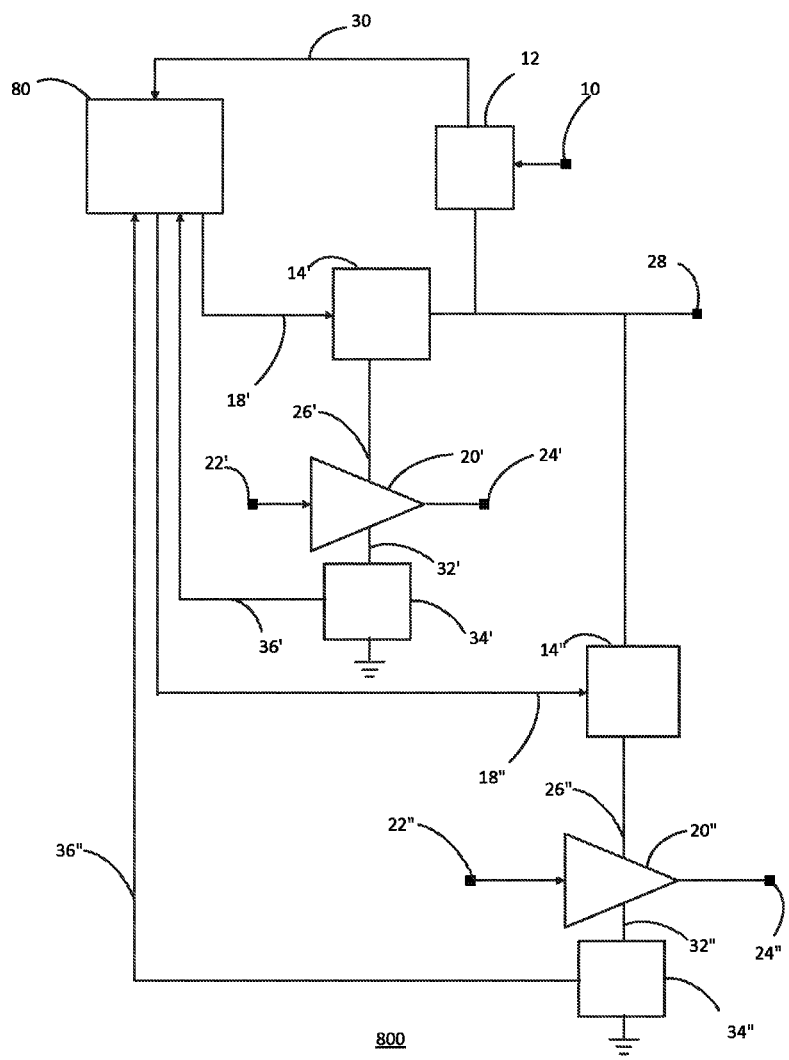
FIG. 8 illustrates a dual amplifier system according to an embodiment.

FIG. 8 shows a dual amplifier system 800. Current monitor 12 may be connected to a first supply node 10. Current monitor 12 may also have a second supply node 28. Power supply output 28 may be connected to a first peak current limiter 14'. A current value output 30 of the current monitor 12 may be connected to a controller 80. A control output 18 from the controller 80 may be connected to the first peak current limiter 14'. A first peak current limited supply output 26' may be connected to a first amplifier 20' having a first amplifier input 22' and first amplifier output 24'. First amplifier 20' may have a ground connection 32' connected to ground via a first amplifier current sensor 32'. The first amplifier current sensor 32' may have a first amplifier current sensor value output 36' connected to controller 80.

A second peak current limited supply output 26' may be connected to a second amplifier 20' having a second amplifier input 22' and second amplifier output 24'. Second amplifier 20' may have a ground connection 32' connected to ground via a second amplifier current sensor 32'. The second amplifier current sensor 32' may have a second amplifier current sensor value output 36' connected to controller 80.

In operation the dual amplifier system 800 receives power supply from a battery connected to first supply node 10. The battery has a predetermined or specified peak current value. Controller 80 may receive continuous measurements of total current supplied by the battery from the battery monitor via the battery monitor output 30. Controller 80 may receive continuous measurements of the current drawn by the first amplifier 20 from the output 36' of the first amplifier current sensor 34'. Controller 80 may receive continuous measurements of the current drawn by the second amplifier 20" from the output 36" of the second amplifier current sensor 34". The controller 80 may at any given time determine the headroom available in the battery for each of the first amplifier 20' and the second amplifier 20" from the current values is supplied. The controller 80 may then set the peak current limit of the first amplifier 20' to a first peak current value and the peak current limit of the second amplifier 20" to a second peak current value. The skilled person will appreciate that in other examples the first amplifier may be a different type of amplifier than the second amplifier. For example the first amplifier may be an audio amplifier and the second amplifier may be an RF amplifier. In other example amplifying systems with multiple amplifiers, the peak current limiter may be common to more than one amplifier. In other example amplifying systems with multiple amplifiers, a single amplifier current sensor may be connected between multiple amplifiers and ground connection.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. An amplifying system for a mobile device, the amplifying system comprising:
   a first supply node operably coupled to a battery, the first supply node to supply a battery current to the battery;
   a current monitor arranged between the first supply node and a second supply node and operable to monitor a current flow between the first and second supply nodes and to provide a monitored current value;
   a peak current limiter configured to limit an amplifier current to an amplifier to not exceed a maximum peak current value and coupled to a one of the first supply node and the second supply node; and
   a controller coupled to the current monitor output, the controller configured to control the peak current limiter, and to set the maximum peak current value of the peak current limiter in dependence on a difference between the battery current and the amplifier current.

2. The amplifier system of claim 1, wherein the controller is operable to prevent the battery current from exceeding a predefined battery peak current value by controlling the peak current limiter to set the maximum peak current value to a value of less than or equal to the difference between a predefined maximum battery peak current value and a system current, wherein the system current is equal to the difference between the battery current and the amplifier current.

3. An amplifying system according to claim 1, wherein the peak current limiter is coupled to the first supply node and where in operation the monitored current value is equal to a difference between the battery current and the amplifier current.

4. An amplifying system according to claim 1, further comprising an amplifier current sensor operable to determine the amplifier current drawn by the amplifier, and wherein the peak current limiter is coupled to the second supply node and wherein in operation the monitored current value is equal to the battery current and the controller is further operable to determine a difference between the monitored current and the amplifier current.

5. The amplifying system of claim 1 wherein the current monitor comprises a sense resistor coupled between the first supply node and the second supply node.

6. The amplifying system of claim 1 wherein the current monitor further comprises a voltage detector having a first input connected to the supply input, a second input connected to the supply output and an output coupled to the current monitor value output and operable to detect a voltage difference corresponding to a current flowing between the first supply node and the second supply node.

7. The amplifying system of claim 1 wherein the amplifier comprises a class-D audio amplifier.

8. The amplifying system of claim 1 wherein the controller comprises a digital signal processor.

9. The amplifying system of claim 1 comprising a further amplifier and a further peak current limiter configured to limit a further amplifier current to the further amplifier to not exceed a further maximum peak current value and coupled to a one of the supply input and the system supply output; wherein the controller is further configured to control the further peak current limiter and wherein the controller is operable set the maximum peak current value and the further maximum peak current value in dependence of a difference between the battery current, the amplifier current and the further amplifier current.

10. The amplifying system of claim 9 wherein the controller is further operable to prevent the battery current from exceeding a predefined battery peak current value by controlling the peak current limiter to set the sum of the maximum peak current value and the further maximum peak current value to a value of less than or equal to the difference between the predefined maximum battery peak current value, the amplifier current and the further amplifier current.

11. An audio amplifier integrated circuit comprising the amplifier system of claim 1.

12. The amplifying system of claim 1 wherein the amplifier comprises a RF amplifier.

13. A RF transmitter comprising the amplifying system of claim 1 and further comprising a coil coupled to the output of the amplifier.

14. A mobile device comprising the RF transmitter of claim 13.

15. A mobile device comprising:
an amplifying system comprising:
 a first supply node operably coupled to a battery,the first supply node to supply a battery current to the battery;
 a current monitor arranged between the first supply node and a second supply node and operable to monitor a current flow between the first and second supply nodes and to provide a monitored current value;
 a peak current limiter coupled to the first supply node, the peak current limiter configured to limit an amplifier current provided to an amplifier to not exceed a maximum peak current value; and
 a controller coupled to the current monitor output, the controller configured to control the peak current limiter, and to set the maximum peak current value of the peak current limiter in dependence on a difference between the battery current and the amplifier current.

16. The mobile device of claim 15, wherein the controller is operable to prevent the battery current from exceeding a predefined battery peak current value by controlling the peak current limiter to set the maximum peak current value to a value of less than or equal to the difference between a predefined maximum battery peak current value and a system current, wherein the system current is equal to the difference between the battery current and the amplifier current.

17. A method comprising:
supplying, by a first supply node of an amplifying system for a mobile device, a battery current to the battery, wherein the first supply node is operably coupled to a battery;
monitoring, by a current monitor arranged between the first supply node and a second supply node, a current flow between the first and second supply nodes;
outputting, by the current monitor, a monitored current value;
limiting, by a peak current limiter, an amplifier current to an amplifier to not exceed a maximum peak current value, wherein the peak current limiter is coupled to a one of the first supply node and the second supply node; and
controlling, by a controller coupled to the current monitor output, the peak current limiter to set the maximum peak current value of the peak current limiter in dependence on a difference between the battery current and the amplifier current.

18. The method of claim 17, further comprising:
preventing, by the controller, the battery current from exceeding a predefined battery peak current value by controlling the peak current limiter to set the maximum peak current value to a value of less than or equal to the difference between a predefined maximum battery peak current value and a system current, wherein the system current is equal to the difference between the battery current and the amplifier current.

19. The method of claim 17, wherein the controller comprises a digital signal processor.

20. The method of claim 17, further comprising:
determining, by an amplifier current sensor, the amplifier current drawn by the amplifier; and
determining, by the controller, a difference between the monitored current and the amplifier current, wherein the peak current limiter is coupled to the second supply node, and the monitored current value is equal to the battery current.

* * * * *